United States Patent [19]
Uchida

[11] Patent Number: 6,009,112
[45] Date of Patent: *Dec. 28, 1999

[54] SEMICONDUCTOR LASER AND MANUFACTURING METHOD THEREFOR

[75] Inventor: Satoshi Uchida, Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/527,724

[22] Filed: Sep. 13, 1995

[30] Foreign Application Priority Data

Sep. 16, 1994 [JP] Japan .................................. 6-222021

[51] Int. Cl.⁶ ............................... H01S 3/085; H01S 3/19
[52] U.S. Cl. .................................................. 372/46
[58] Field of Search .............................. 372/46, 43

[56] References Cited

U.S. PATENT DOCUMENTS

| | | |
|---|---|---|
| 4,567,060 | 1/1986 | Hayakawa et al. . |
| 4,890,293 | 12/1989 | Taneya et al. . |
| 4,984,243 | 1/1991 | Kagawa et al. ............................ 372/46 |
| 5,210,767 | 5/1993 | Arimoto et al. . |
| 5,218,613 | 6/1993 | Serreze . |
| 5,303,255 | 4/1994 | Kudo et al. ................................ 372/46 |

FOREIGN PATENT DOCUMENTS

| | | | |
|---|---|---|---|
| 477 013 A2 | 3/1992 | European Pat. Off. . | |
| 59-127864 | 7/1984 | Japan ........................ 372/46 |
| 61-74384 | 4/1986 | Japan ........................ 372/46 |
| 61-75585 | 4/1986 | Japan ........................ 372/46 |
| 2-137386 | 5/1990 | Japan ........................ 372/46 |
| 2-260588 | 10/1990 | Japan ........................ 372/46 |
| 3-30386 | 2/1991 | Japan ........................ 372/46 |

OTHER PUBLICATIONS

Abstract of Japanese Patent Publ. No. 02–129915, dated May 7, 1992.

*Primary Examiner*—James W. Davie
*Attorney, Agent, or Firm*—Nikaido Marmelstein Murray & Oram LLP

[57] ABSTRACT

A semiconductor laser having a double hetero junction structure including: an active layer; cladding layers including an upper layer and a lower layer, the cladding layers sandwiching the active layer; and a current blocking layer including a stripe recess for acting as a current passage. The current blocking layer is provided within at least one of the cladding layers. The current blocking layer comprises a plurality of layers, at least one layer of the layers having a slit therein extending transversely to the stripe recess.

7 Claims, 10 Drawing Sheets

SEMICONDUCTOR LASER AND MANUFACTURING METHOD THEREFOR

BACKGROUND OF THE INVENTION

The present invention relates to a semiconductor laser and more particularly, a high-power semiconductor laser employed as a light source for a pickup in an optical disk drive for writing and reading of data on a minidisk, photomagnetic disk, CD-R, or the like.

High-power semiconductor lasers have been developed for producing an output power of more than 30 mW (or over 40 mW for CD-R) and used as light sources in disk drives for minidisks, photomagnetic disks, or CD-Rs. In each case, a high intensity of light output is needed for carrying out a data writing action while a low output power is sufficient for executing a data reading action.

Such high-power semiconductor lasers should provide substantial characteristics including (1) single lateral mode oscillation prior to emission of a high output power, (2) low astigmatic difference, (3) low ellipticity, (4) low noise, and (5) high operational reliability.

For implementation of (1) single lateral mode oscillation prior to emission of a high output power, a refractive index waveguide structure is employed where a light wave is confined in parallel to an active layer (referred to as in a lateral plane hereinafter). Also, a gain waveguide type of the semiconductor laser having no difference of the index of refraction on the lateral plane may be used. Although longitudinal multi mode oscillation in the gain waveguide type allows a lower optical feedback noise, it creates a high astigmatic difference. In addition, it fails to confine light in the lateral plane, action in the lateral mode will be unstable causing a kink. The semiconductor laser having the refractive index waveguide structure performs multiplexing in the longitudinal mode by superimposing a high frequency current of several hundreds megahertzes over a laser driving current in order to attenuate coherent radiation and thus, lower the optical feedback noise. However, this requires a high frequency superimposing circuit in addition to a basic semiconductor laser driving circuit, thus increasing the overall size, the consumption of power, and the production cost. Also, it is likely to generate a high frequency electromagnetic noise which may give serious damage to a relevant machine such as a computer.

It is also known to use a self-excited oscillation technique for shifting the longitudinal mode to the multi mode in the refractive index wavelength type of the semiconductor laser without performing the high frequency superimposing. The self-excited oscillation in the refractive index waveguide structure is implemented by decreasing the fraction index difference in the lateral plane (See "Semiconductor layer" by Ryoichi Ito et al, p. 121, Baifukan, 1989). When the refractive index difference in the lateral plane is decreased, light runs off laterally and out-of-stripe regions of the active layer which remain deenergized with no current being applied act as saturable absorption areas.

Figure 7:
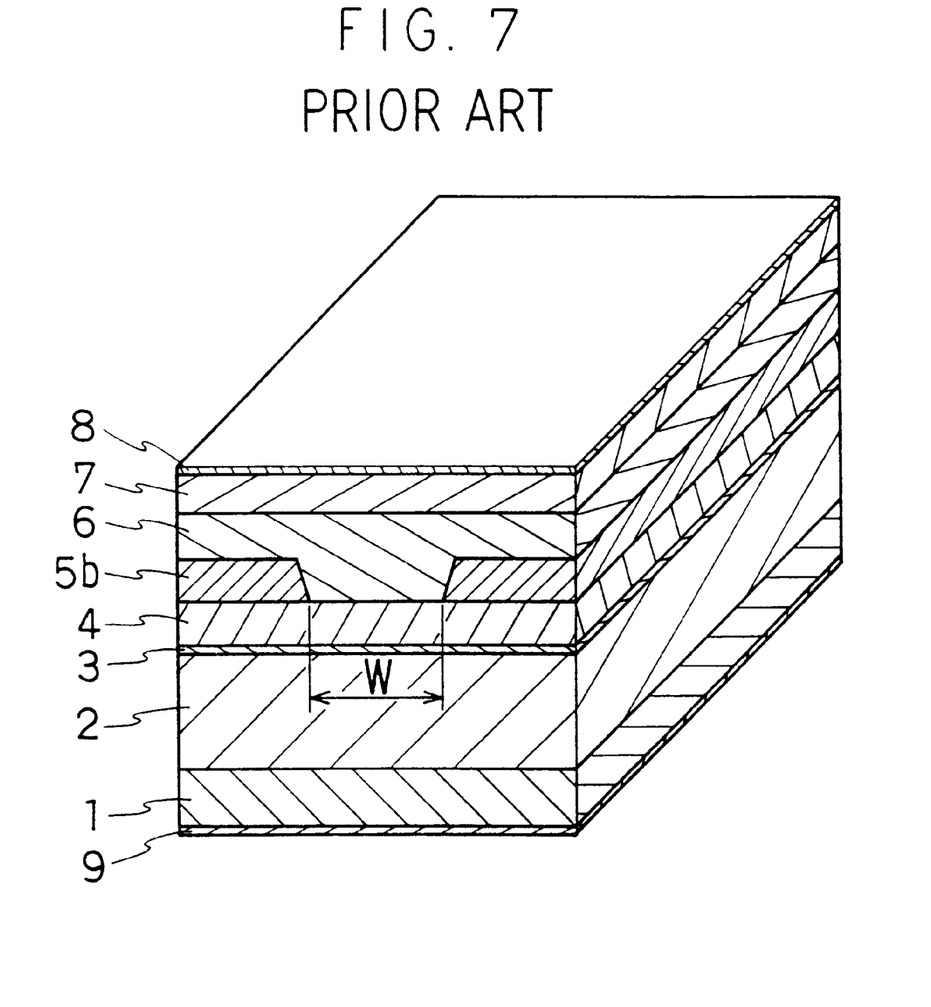
FIG. 7 illustrates a structure of a prior art semiconductor laser.

FIG. 7 illustrates an example of the semiconductor laser having a known refractive index waveguide structure. As shown, there are provided a GaAs substrate 1 of n-type (expressed by n-hereinafter), an n-$Al_xGa_{1-x}As$ cladding layer 2, an $Al_yGa_{y-1}As$ active layer 3, a first $Al_xGa_{1-x}As$ cladding layer 4 of p-type (expressed by p-hereinafter), an n-GaAs current blocking layer 5b, a second p-$Al_xGa1_{1-x}As$ cladding layer 6, a p-GaAs contact layer 7, and two, upper and lower, electrodes 8, 9. The n-GaAs current blocking layer 5b confines an injection current in an active area of a stripe shape having a width W and absorbs light produced in the active layer so that the complex refractive index is different between inside and outside of the stripe active area. This allows a light wave to be confined in the lateral plane and guided steadily in the stripe active area of width W.

Figure 8:
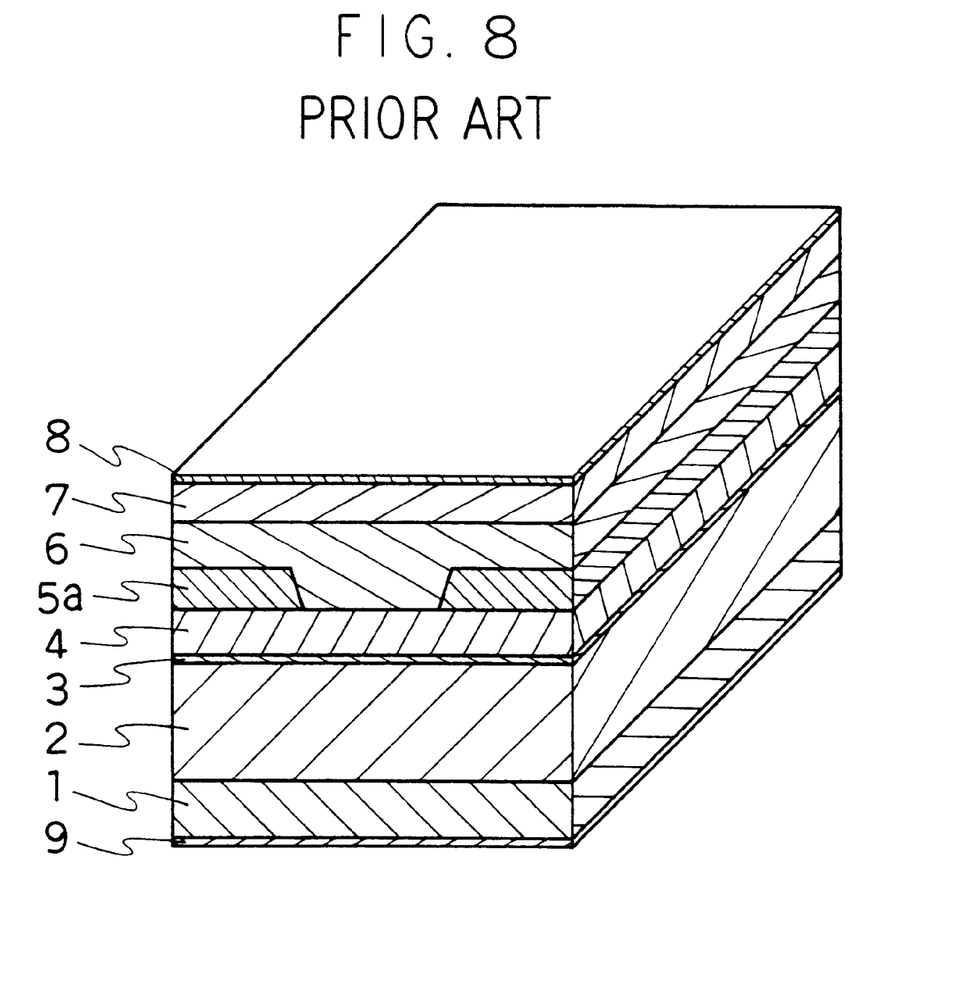
FIG. 8 illustrates a structure of another prior art semiconductor laser.

As compared with the semiconductor laser with the absorption loss associated refractive index waveguide structure, shown in FIG. 7, where the current layer is made of GaAs, another refractive index waveguide structure having the current blocking layer made of AlGaAs is also known (Proceeding 17a-V-1 of 1992 Applied Physics Convention (Autumn) in Japan). Shown in FIG. 10 are an n-GaAs substrate 1, an n-$Al_xGa_{1-x}As$ cladding layer 2, an $Al_yGa_{1-y}As$ active layer 3, a first p-$Al_xGa_{1-x}As$ cladding layer 4, an n-$Al_zGa_{1-z}As$ current blocking layer 5a (z≧x), a second p-$Al_xGa_{1-x}As$ cladding layer 6, a p-GaAs contact layer 7, and two, upper and lower, electrodes 8, 9. The mixed crystal factor z of Al in the n-$Al_zGa_{1-z}As$ current blocking layer 5a is greater than the mixed crystal factor x of Al in the cladding layers 2, 4 and 6 so that its refractive index is lower than that of the stripe recess. A difference in the refractive index causes a light wave to be confined to the stripe as guided. In the structure, absorption loss caused by the current blocking layer is avoided and laser oscillation will be implemented with efficiency for producing a higher output power. Also, when the mixed crystal factor z of Al is approximated to x of the cladding layer, the refractive index difference in the lateral plane decreases. Resultant escape of light from the stripe will trigger the self-excited oscillation. Accordingly, the semiconductor laser with the foregoing structure will minimize optical feedback noise (See Japanese Patent Laid-open Publication 5-160503 (1993)).

In general, the refractive index waveguide type semiconductor laser is directed to produce single longitudinal mode oscillation thus being high in the coherency. Hence, the optical feedback noise will be unavoidable failing to satisfy the requirement (4) of low noise. More specifically, when the return light reflected on a disk comes into the semiconductor laser, it causes the laser oscillation to be unstable. Such an optical feedback noise is not negligible in the reading of data as it may cause data reading error.

It is a good idea for minimizing the refractive index difference in the lateral plane in the structure shown in FIG. 7 to increase the thickness of the first p-$Al_xGa_{1-x}As$ cladding layer 4. However, the increased thickness allows the injection current to be hardly applied in a width W to the active layer. Consequently, the structure will be declined in the characteristics, e.g. a threshold oscillation is increased. The light escaped from the stripe is absorbed in the n-GaAs current blocking layer 5 and the self-excited oscillation will hardly be commenced. It is thus unfavorable to fabricate a high-power self-excited laser from the structure shown in FIG. 7. Such high-power self-excited lasers may be fabricated but with very low productivity and their mass production will never be practical.

When the refractive index difference type waveguide structure shown in FIG. 8 is decreased in the refractive index difference in the lateral plane, it may be similar in the characteristics to a gain waveguide type semiconductor laser. In particular, the astigmatic difference will be highly increased during irradiation of a low output. Also, the pattern of light emission extending in the lateral plane may be varied depending on an intensity of output power.

Although the above mentioned structure is also high in the slope efficiency (a ratio between output power and injection current) which is substantial for optimum oscillation thus minimizing an operating current, noise from its power source causes the output power to be fluctuated. This may result in generation of critical noise or internal fracture by excessive emission of light.

SUMMARY OF THE INVENTION

It is an object of the present invention to provide a low-noise semiconductor laser capable of producing a high power of light output and arranged for use in a read/write pickup device provided with no high-frequency superimposing circuit.

It is another object of the present invention to provide a method for producing a semiconductor laser which produces a high power of light output with a low noise.

A semiconductor laser according to the present invention has a double herero junction structure in which at least one of two, upper and lower, cladding layers sandwiching from upper and lower an active layer is associated with a current blocking layer which has a stripe recess provided therein for acting as a current passage. In particular, the current blocking layer comprises a plurality of layers, at least one of which layers having a slit therein extending tranversely or laterally to the stripe recess acting as the current passage.

It is more advantageous in control of the laser absorption effect when the layers of the current blocking layer include a layer greater in a forbidden band gap than the active layer and a layer equal to or smaller than the active layer and also, the slit is arranged in the latter layer equal to or smaller in another forbidden band gap than the active layer.

Preferably, the foregoing semiconductor laser is installed in an optical pickup system as a light source for writing and reading of records, whereby a high-frequency superimposing circuit will be eliminated.

A method for producing a semiconductor laser according to the present invention comprises the steps of:

(a) growing on a semiconductor substrate in a sequence at least a lower cladding layer, an active layer, a first upper cladding layer, a first current blocking layer, and a second current blocking layer;

(b) etching both the first current blocking layer and second current blocking layer to form the stripe recess for a current passage and then etching the second current blocking layer to form the slit; and (c) growing further in a sequence a second upper cladding layer and a contact layer.

Another method for producing a semiconductor laser according to the present invention comprises the steps of:

(d) growing on a semiconductor substrate of a first conductive type GaAs in a sequence a lower cladding layer of a first conductive type $Al_xGa_{1-x}As$ (where $0.3 \leq Y \leq 0.9$), an active layer of $Al_yGa_{1-y}As$ (where $0 \leq Y \leq 0.3$ and y<x), a first upper cladding layer of the second conductive type $Al_xGa_{1-x}As$, an etching stop layer of GaAs, a first current blocking layer of a first conductive type $Al_zGa_{1-z}As$ (where $0.3 \leq z \leq 0.9$ and $x \leq z$), a second current blocking layer of the first conductive type GaAs, an evaporation preventing layer of $Al_wGa_{1-w}As$ (where $0.05 \leq w \leq 0.9$), and an oxidation preventing layer of GaAs;

(e) etching both the oxidation and evaporation preventing layers partially to form a slit which extends across a stripe recess acting as a current passage;

(f) etching the oxidation preventing layer, the evaporation preventing layer, the second current blocking layer, and the first current blocking layer, until the etching stop layer is exposed, to form the stripe recess;

(g) removing the oxidation preventing layer, the etching stop layer exposed during the etching of forming the stripe recess, and the second current blocking layer exposed during the etching of forming the slit by thermal etching in which molecular beams are irradiated and high-temperature heat is applied; and (h) growing further in a sequence a second upper cladding layer of the second conductive type $Al_xGa_{1-x}As$ and a contact layer of the second conductive type GaAs.

It is noted that the first conductive type and second conductive type represent n-type and p-type respectively or vice versa. If the first conductive type is n-type, the second conductive type represents p-type. If the first conductive type is p-type, the second conductive type then represents n-type.

For making a semiconductor laser with higher precision, the step of etching both the oxidation and evaporation preventing layers partially for forming a slit and the step of etching the oxidation preventing layer, the evaporation preventing layer, the second current blocking layer, and the first current blocking layer to form the stripe recess are implemented by dry etching technique.

A further method for producing a semiconductor laser according to the present invention comprises the steps of:

(i) growing on a semiconductor substrate in a sequence at least a lower cladding layer, an active layer, a first upper cladding layer, a second upper cladding layer, and a cap layer;

(j) forming a stripe-shaped masking on the cap layer;

(k) etching the cap layer and the stripe-shaped masking;

(l) growing on a surface exposed by the etching in a sequence a first current blocking layer and a second current blocking layer;

(m) etching selectively a part of the second current blocking layer to form a slit which extends across the stripe-shaped masking;

(n) removing the stripe-shaped masking; and (o) growing further a third upper cladding layer and a contact layer.

For determining and controlling the depth of the etching at a higher accuracy, an etching stop layer is provided between the first upper cladding layer and second upper cladding layer grown at the (i) step.

For producing a semiconductor laser which produces an laser output of a frequency suited for use with an optical pickup device, the semiconductor substrate is formed of the first conductive type GaAs, the lower cladding layer is formed of the first conductive type $Al_xGa_{1-x}As$ (where $0.3 \leq x \leq 0.9$), the active layer is formed of $As_yGa_{1-y}As$ (where $0 \leq y \leq 0.3$, y<x), the etching stop layer is formed of the second conductive type $Al_vGa_{1-v}As$ (where $0.1 \leq v \leq 0.7$ and v<x), the second upper cladding layer is formed of the second conductive type $Al_xGa_{1-x}As$, the cap layer is formed of the second conductive type GaAs, the stripe-shaped masking is an insulating layer, the first current blocking layer of the first conductive type $Al_zGa_{1-z}As$ (where $0.3 \leq Z \leq 0.9$ and $x \leq z$), the second current blocking layer is formed of the first conductive type GaAs, the third upper cladding layer is formed of the second conductive type $Al_xGa_{1-x}As$, and the contact layer is formed of the second conductive type GaAs.

In the semiconductor laser of the present invention, the region where the second current blocking layer is absent from a gain waveguide with no refractive index difference in the lateral plane or a refractive index waveguide with a weak refractive index difference in the same plane. Meanwhile, in the region where the second current blocking layer is present, light energy is trapped as a complex refractive index difference due to the absorption loss in the current blocking layer is dominant. In other words, two different functions, one for performing self-excited oscillation in a vertical multi-mode during emission of a high power output at less absorption loss and the other for performing stable lateral mode oscillation with a great refractive index difference in the lateral plane while minimizing the astigmatic difference are operable in a single structure. Accordingly, the semiconductor laser of the present invention offers the advantages of the two functions in a combination.

Also, the slit can easily be provided by the method in which after the current blocking layers are grown, the stripe recess and the slit are formed in the current blocking layers before growing the second upper cladding layer. While the semiconductor layers are made of AlGaAs material, the etching stop layer and the evaporation preventing layer are formed of GaAs. This allows the etching stop layer and evaporation preventing layer to be readily removed by evaporation in an MBE apparatus after the etching process, thus maintaining the following step of growing further semiconductor layers under a clean atmosphere.

According to the other method for producing a semiconductor laser, after the upper cladding layer is grown for producing a current injection area, the current blocking layer is formed so that it locates on both sides of the upper cladding layer and thus, no etching process is applied during growing the semiconductor layer of the current injection area. As the result, the semiconductor of multi-layer structure will be fabricated under a highly clean atmosphere.

BRIEF DESCRIPTION OF THE DRAWINGS

FIGS. 1($a$) and 1($b$) illustrate a structure of a semiconductor laser according to the present invention;

FIGS. 2($a$) to 2($e$) show steps of producing another semiconductor laser of the present invention;

FIGS. 3($b2$) and 3($e2$) are cross sectional views taken along the lines B—B and C—C of FIGS. 2($b$) and 2($e$) respectively;

FIGS. 4($a$) to 4($f$) show steps of producing a further semiconductor laser of the present invention;

DETAILED DESCRIPTION OF THE INVENTION

A semiconductor laser according to the present invention will be described referring to FIGS. 1($a$) and 1($b$).

Figure 1A:
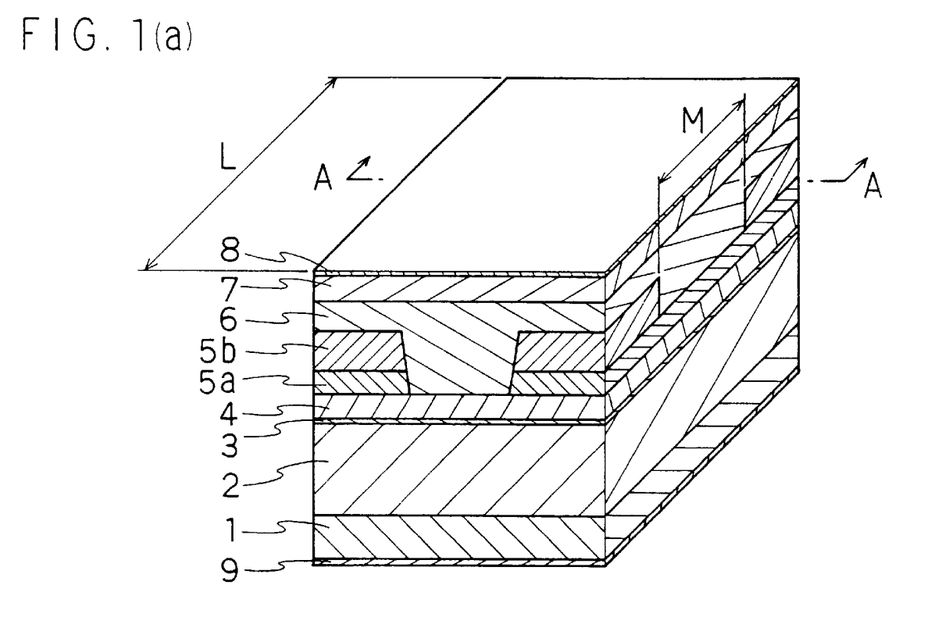
Figure 1B:
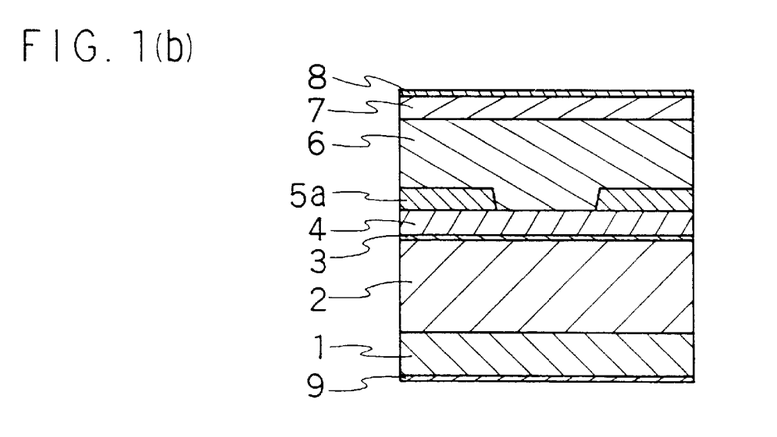

FIG. 1($a$) illustrates a schematic chip structure of the semiconductor laser of the present invention where longitudinal edges are exposed and FIG. 1($b$) is a cross sectional view taken along the line A—A of FIG. 1($a$).

As shown in FIG. 1($a$), there are provided an n-GaAs substrate 1, a lower cladding layer 2 of n-$Al_xGa_{1-x}As$ (where $0.3 \leq x \leq 0.9$ or more precisely, x=0.6), an $Al_yGa_{1-y}As$ active layer 3 (where $0 \leq y \leq 0.3$ or more specifically, y=0.12), a first upper cladding layer 4 of p-$Al_xGa_{1-x}As$ (for example, x=0.6), a first current blocking layer 5$a$ of n-$Al_zGa_{1-z}As$ (where $0.3 \leq z \leq 0.9$, $x \leq z$ or more precisely, z=0.63), a second current blocking layer 5$b$ of n-GaAs, a second upper cladding layer 6 of p-$Al_xGa_{1-x}As$ (for example, x=0.6), a p-GaAs contact layer 7, and two, upper and lower, electrodes 8, 9. L is the resonator length and M is a part of L representing the distance of a slit provided in the place between the n-GaAs second current blocking layer 5$b$. As the mixed crystal factor of Al is increased, the size of each forbidden band gap increases. When it is decreased, each forbidden band gap will decrease. Also, the current blocking layer is a non-absorption layer which absorbs no light of the active layer 3 when the forbidden band gap is larger than that of the active layer 3. On the contrary, the current blocking layer is an absorption layer when the forbidden band gap is equal to or smaller than that of the active layer 3. As shown, the first current blocking layer 5$a$ is a non-absorption layer while the second current blocking layer 5$b$ is an absorption layer. The semiconductor laser of the present invention has at least two current blocking layers, one for an absorption layer and the other for a non-absorption layer.

The second current blocking layer 5$b$ is provided with a slit M for acting as the light absorption layer. As best shown in the cross sectional view of FIG. 1($b$) taken along the line A—A across the slit M, the second current blocking layer 5$b$ of n-GaAs which is illustrated in FIG. 1($a$) is not present. This allows loss due to absorption of the second current blocking layer 5$b$ to be avoided, thus forming a gain type waveguide structure which has no refractive index difference in the lateral plane at z=x. If z is slightly greater than x, the structure turns to a refractive index waveguide type which has a small difference in the index waveguide structure produces self-excited oscillation as described previously. More particularly, the slit M allows vertical multi-mode oscillation. In addition, the slit M gives no absorption loss and is advantageous for producing a high power output.

In the other area than the slit M, the refractive index profile in the lateral plane is largely affected by a complex refractive index difference caused by the absorption loss of the second n-GaAs current blocking layer 5$b$ when the mixed crystal factor z of Al is equal to or greater than x.

Accordingly, the refractive index difference in the lateral plane across the area is increased enough to ensure stable lateral mode oscillation and smaller astigmatic difference.

As described, the semiconductor laser of the present invention has in a combination advantages of both the refractive index waveguide structure which provides no absorption loss and the complex refractive index waveguide structure which produces absorption loss and will thus overcome the disadvantage of the prior art. Also, the structure of the present invention is modulated by varying the design parameters so that one of three major characteristics, vertical multi-mode oscillation, low astigmatic difference, and high power output, is emphasized. For example, if the vertical multi-mode oscillation is most desired, the ratio of the slit distance M to the resonator length L is increased. If the astigmatic difference is emphasized, the mixed crystal factor z of Al is increased. Although the n- and p-type layers are developed on the n-type substrate in the above description, they may be inverted in the type. This is also applicable to a method which will follow.

Some examples of the method of producing the semiconductor laser of the present invention will not be described.

EXAMPLE 1

FIGS. 2($a$) to 2($e$) and 3($b2$) to 2($e2$) show an exemplary procedure of producing the semiconductor laser of the present invention.

Figure 2A:
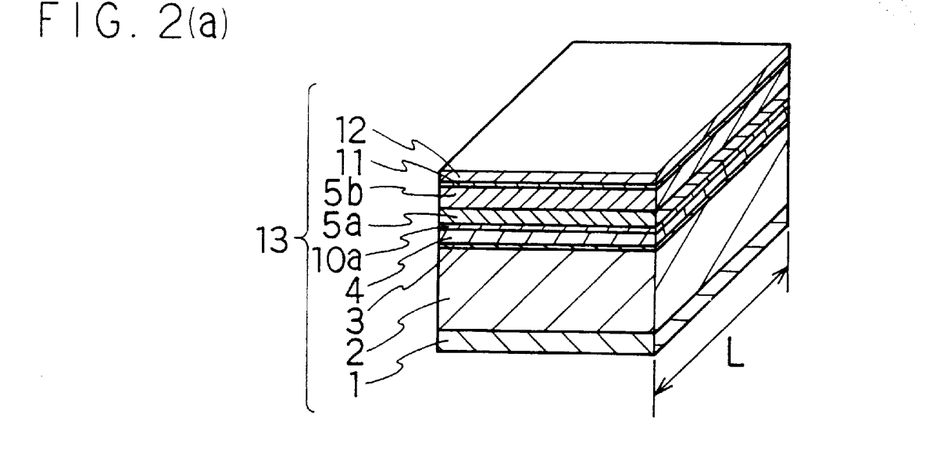

The procedure starts with placement of an n-GaAs substrate 1 in an MBE or MOCVD apparatus. Then, the n-GaAs substrate 1 is subjected to a molecular beam epitaxy method for growing thereon in a sequence a lower cladding layer 2 of n-$Al_xGa_{1-x}As$, an $Al_yGa_{1-y}As$, an etching stop layer 10a of n-GaAs, a first current blocking layer 5a of n-$Al_zGa_{1-z}As$ (where z≧x), a second current blocking layer 5b of n-GaAs, an evaporation protective layer 11 of n-$Al_wGa_{1-w}As$ (where 0.05≦w≦0.9 or more precisely, w=0.12), and a GaAs protective layer 12, thus forming a first multi-layer growth structure 13 as shown in FIG. 2(a). The n-GaAs etching stop layer 10a is provided for protecting the first upper cladding layer 4 during the etching to the first current blocking layer 5a. In practice, it remains outside the stripe and beneath the first current blocking layer 5a and is designed to have a thickness of less than 200 angstroms for minimizing the absorption loss.

Figure 2B:
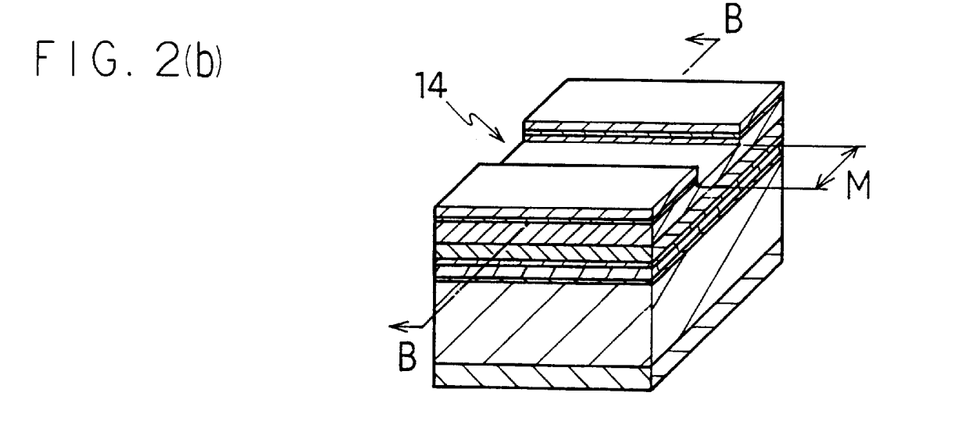

After the first multi-layer growth structure 13 is removed out from the MBE or MOCVD apparatus, a slit 14 having a width of M is formed by a photolithography technique in the upper surface of the first multi-layer growth structure 13 as shown in FIG. 2(b). More particularly, a definite etchant or etching liquid such as sulfuric acid solvent is applied to remove parts of the GaAs protective layer 12 and the n-$Al_wGa_{1-w}As$ evaporation protective layer 11 until the second n-GaAs current blocking layer 5b is slightly etched, thus forming the slit 14. The depth of the slit 14 is not critical. A cross section taken along the line B—B of FIG. 2(b) is illustrated in FIG. 4(b2).

Figure 2C:
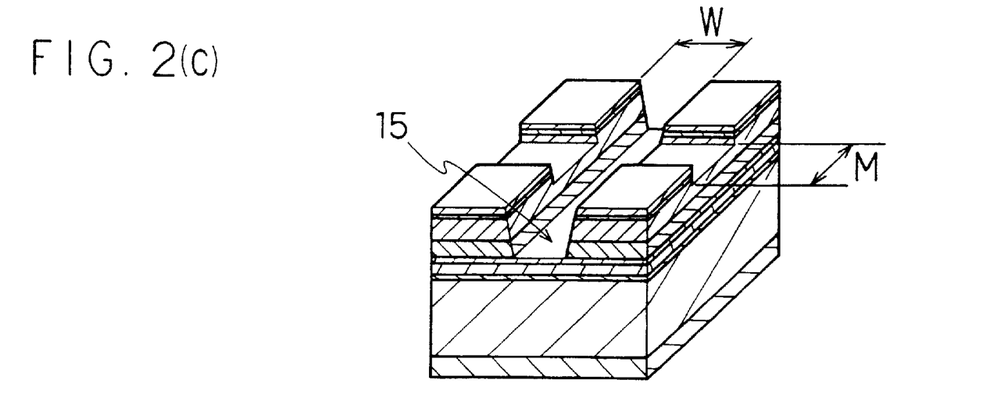
Figure 2D:
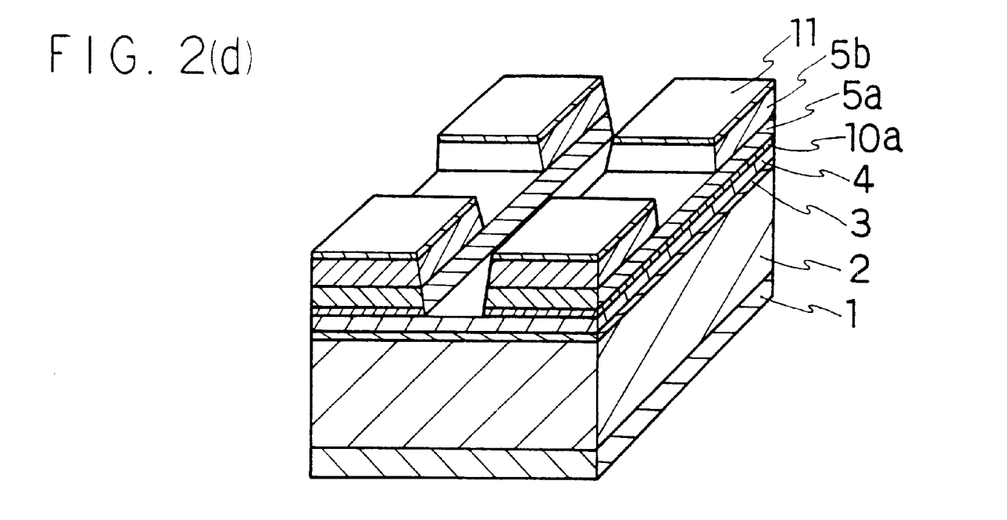

Then, a stripe recess 15 having a width of W is formed in the same surface so that it extends laterally angle to the slit 14, as shown in FIG. 2(c). More specifically, an etching liquid of sulfuric acid solution is first used for etching the GaAs protective layer 12 and the n-$Al_wGa_{1-w}As$ evaporation protective layer 11. This is followed by selective etching the second n-GaAs current blocking layer 5b with a GaAs etchant such as ammonia solvent. Also, a liquid of hydrochloric acid at 60° C. is applied for etching the first n-$Al_zGa_{1-z}As$ current blocking layer 5a. As the hydrochloric acid is not effective to etch the GaAs material, its etching action is ceased when the n-GaAs etching stop layer 10a is exposed at the bottom of the stripe recess 15. The n-GaAs etching stop layer 10a acts as a layer for terminating the etching effect.

Succeedingly, the first multi-layer growth structure 13 is placed again in the MBE apparatus and exposed to arsenic molecular beams for heating up to 740° C. the GaAs protective layer 12 with the slit 14 formed at a step shown in FIG. 2(b) and the stripe recess 15 formed at a step shown in FIG. 2(c). As the result, the GaAs protective layer 12, a portion of the second n-GaAs current blocking layer 5b exposed at the bottom of the slit 14, and a portion of the n-GaAs etching stop layer 10a exposed at the bottom of the stripe recess 15 are evaporated. While the heating temperature is increased, the GaAs material starts evaporating but the $Al_wGa_{1-w}As$ and $Al_zGa_{1-z}As$ materials remain intact. This process is thus applicable for etching the GaAs material effectively. The thermal etching process can be executed in any MBE apparatus but not in an MOCVD apparatus.

Figure 2E:
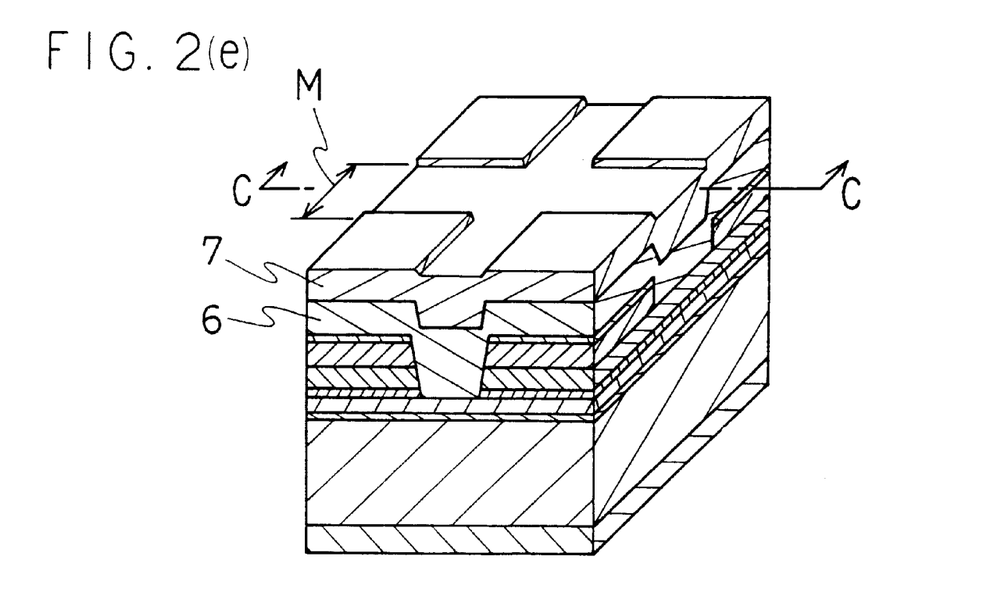
Figure 3:
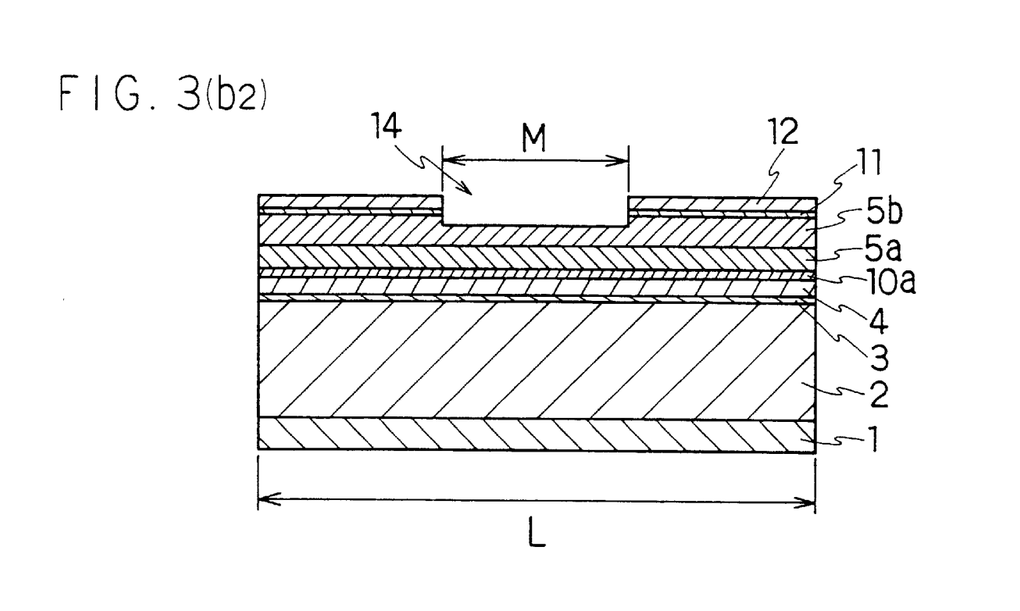

While the multi-layer growth structure 13 being placed in the MBE apparatus (without removed out from the MBE apparatus after completion of the thermal etching process), an second upper cladding layer 6 of p-$Al_xGa_{1-x}As$ and a contact layer 7 of p-GaAs are grown in a sequence on the structure 13. The result is shown in FIG. 2(e) and FIG. 3(e2) is a cross sectional view taken along the line C—C of FIG. 2(e). As apparent, the second n-GaAs current blocking layer 5b is absent in the cross section. The n-GaAs etching stop layer 10a beneath the first n-$Al_zGa_{1-z}As$ current blocking layer 5a is as thin as less than 200 angstroms and its light absorbing effect will be negligible. In other words, the semiconductor laser structure allows the absorption loss type waveguide to be eliminated across the width M of the slit 14 there the mixed crystal factor z of Al in the first n-$Al_zGa_{1-z}As$ current blocking layer 5a only is dominant.

Finally, the rear surface of the semiconductor of multi-layer structure is subjected to lapping of a given thickness and electrodes are arranged on both the lower surface of the n-GaAs substrate 1 and the upper surface of the p-GaAs contact layer 7. The multi-layer structure is then sliced to semiconductor laser chips.

According to the method of the present invention, the n-GaAs etching stop layer 10a acts not only as a layer for terminating the etching effect but also as a passivation layer for preventing oxidation of the first p-$Al_xGa_{1-x}As$ upper cladding layer 4 in the air. Also, the thermal etching process in a highly vacuum MBE apparatus is employed for selective removal of unwanted GaAs materials, the stripe recess 15 can accurately be formed to a desired depth without the first upper cladding layer 4 being exposed to the air. Simultaneously, the slit 14 is formed by thermally etching the second n-GaAs current blocking layer 5b while the first n-$Al_zGa_{1-z}As$ current blocking layer 5a remains unaffected. Accordingly, the semiconductor lasers of quality will be fabricated at a higher yield rate perproduction.

In Example 1, the AlGaAs materials are used for forming the etching stop and oxidation preventing layers which are etched before subjected to the thermal etching in an MBE apparatus to form the stripe recess. If the thermal etching is not wanted or other appropriate semiconductor materials such as AlGaInP are used, and or combination of the etching stop, oxidation preventing, the other protective layers may be eliminated. Those layers are not limited to the n-type but p-type is applicable with equal success.

EXAMPLE 2

Another example of the method of making the semiconductor laser of the present invention will be explained referring to FIGS. 4(a) to 4(f).

Figure 4A:
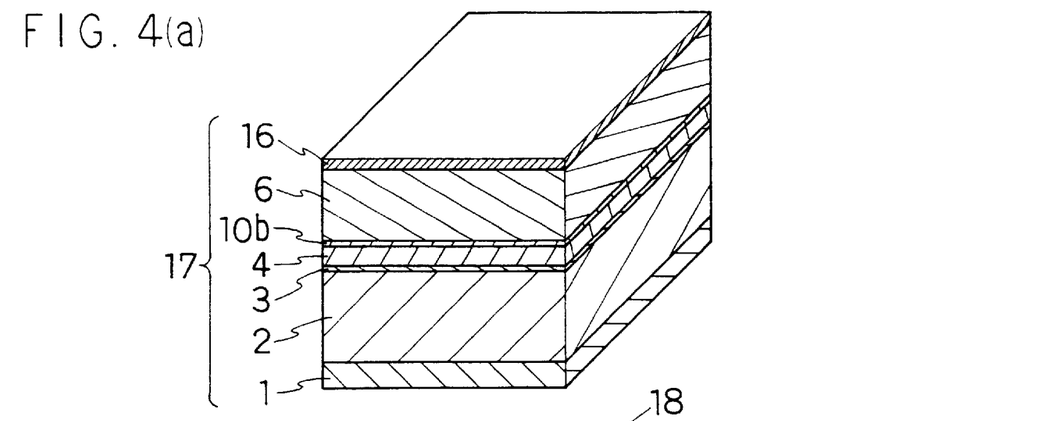

An n-GaAs substrate 1 is first placed in an MBE or MOCVD apparatus and then, subjected to a molecular beam epitaxy method for growing thereon in a sequence a lower cladding layer 2 of n-$Al_xGa_{1-x}As$, an $Al_yGa_{1-y}As$ active layer 3, a first upper cladding layer 4 of p-$Al_xGa_{1-x}As$, an etching stop layer 10b of p-$Al_vGa_{1-v}As$ (where 0.1≦v≦0.7 and v<<x), a second upper cladding layer 6 of p-$Al_xGa_{1-x}As$, and a cap layer 16 of p-GaAs, thus forming a first multi-layer growth structure 17 as shown in FIG. 4(a).

Figure 4B:
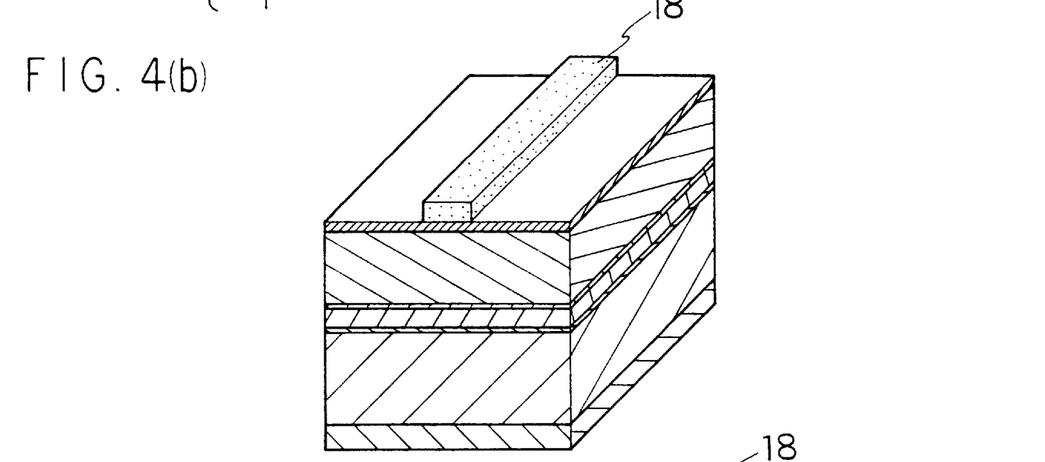

After the first multi-layer growth structure 17 is removed out from the MBE or MOCVD apparatus, an insulating layer 18 of $Si_3N_4$ is arranged to a stripe shape as shown in FIG. 4(b), using a CVC apparatus.

Figure 4C:
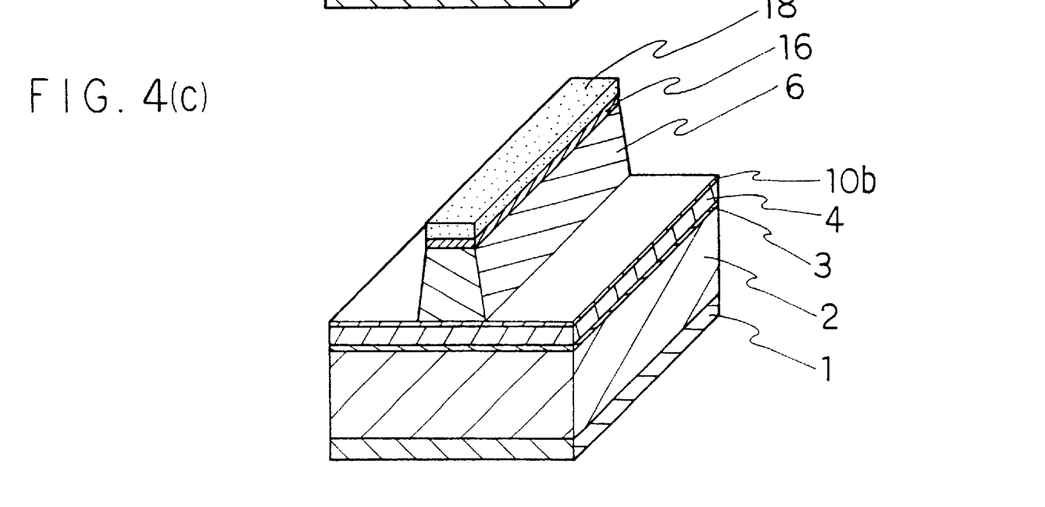

While the $Si_3N_4$ insulating layer 18 acts as a masking, both the cap layer 16 of p-GaAs and the second upper cladding layer 6 of p-$Al_xGa_{1-x}As$ are etched as shown in FIG. 4(c). For etching the p-GaAs cap layer 16, a selective etchant such as sulfuric acid solvent or ammonia solvent capable of etching only GaAs materials is used. For etching the second p-$Al_xGa_{1-x}As$ upper cladding layer 6, another definite etchant such as hydrochloric acid or fluoric acid etching speed of which may be controlled by varying the mixed crystal factor of Al is used. In this example, the mixed crystal factor v of Al is minimized to 0.2 as smaller than x (=0.6) thus allowing the p-Al$_y$Ga$_{1-y}$As etching stop layer 10b to determine the depth of etching action.

Figure 4D:
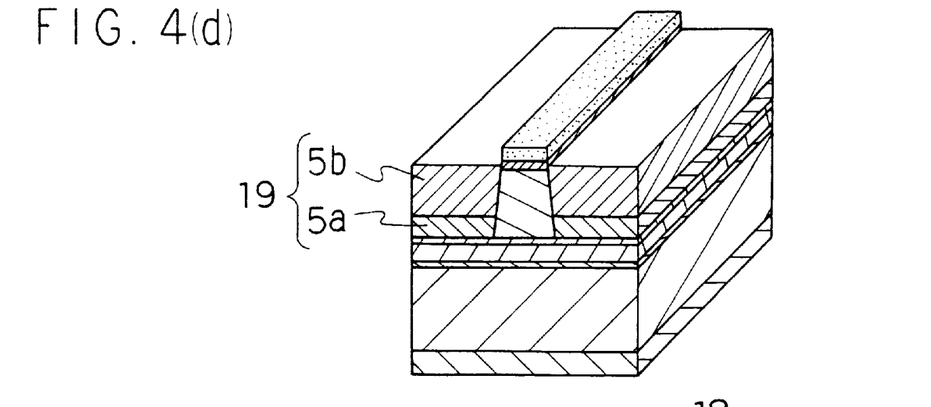

Then, the first multi-layer growth structure 17 is placed again in the MOCVD apparatus for growing thereon off the Si$_3$N$_4$ insulating layer 18 in a sequence a first current blocking layer 5a of n-Al$_z$Ga$_{1-z}$As and a second current blocking layer 5b of n-GaAs, thus forming a second multi-layer growth structure 19 shown in FIG. 4(d). The MOCVD method is preferred since the growing of selective layers is feasible by optimizing some of conditions.

Figure 4E:
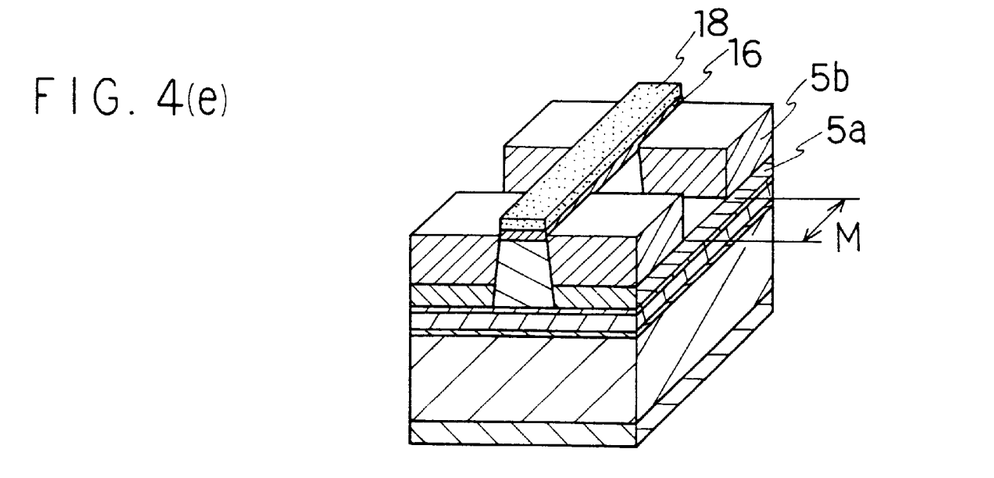

After the second multi-layer growth structure 19 is removed out from the MOCVD apparatus, a stripe recess having a width of M is formed in the second n-GaAs current blocking layer 5b so that it extends at a right angle to the Si$_3$N$_4$ insulating layer 18, as shown in FIG. 4(e). This is implemented by using an ammonia etchant which removes GaAs materials selectively.

Figure 4F:
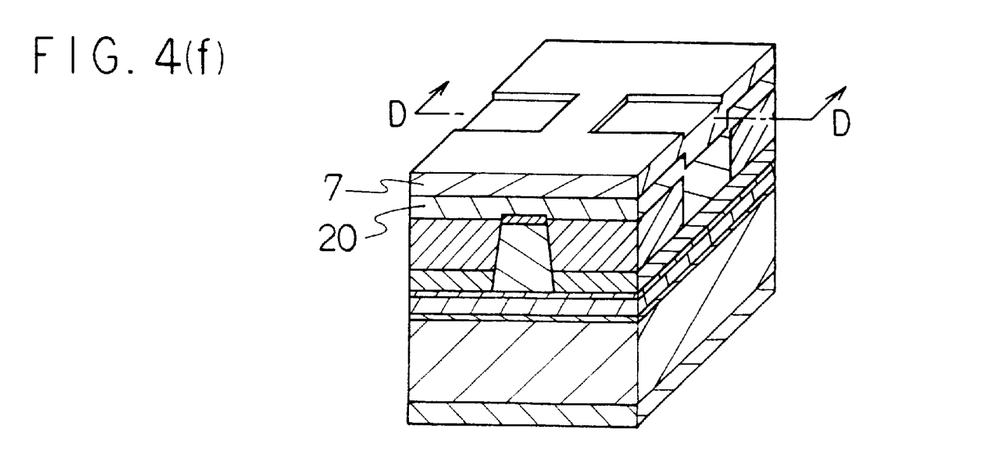
Figure 5:
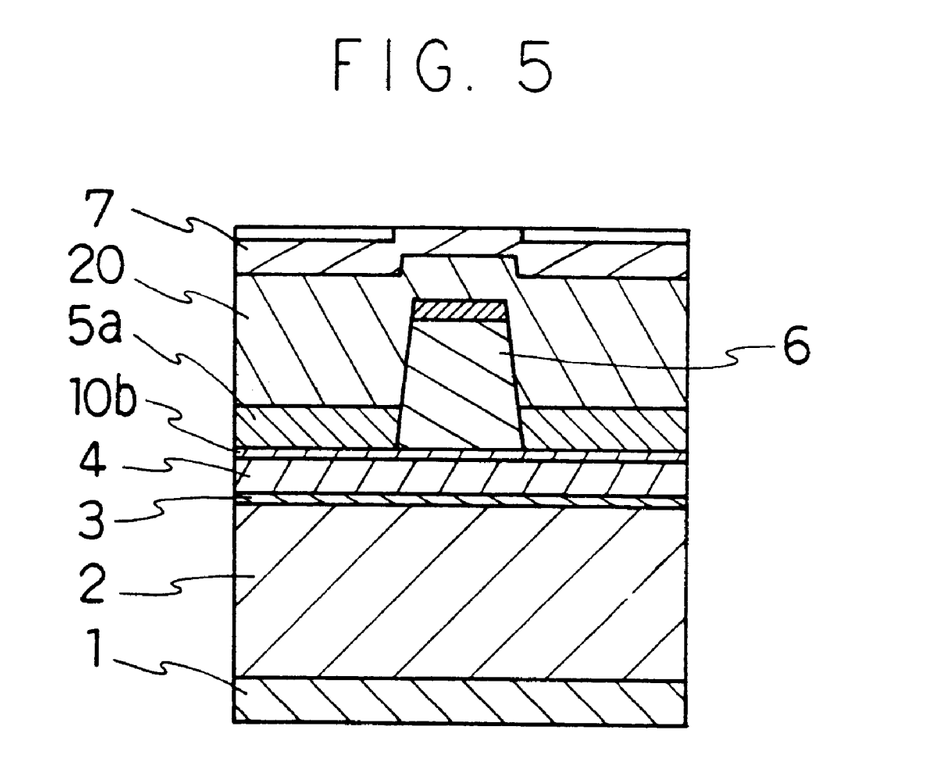
FIG. 5 is a cross sectional view taken along the line D—D of FIG. 4($f$)

Following the removal of the Si$_3$N$_4$ insulating layer 18, a third upper cladding layer 20 of p-Al$_x$Ga$_{1-x}$As and a contact layer 7 of p-GaAs are grown in a sequence on the structure 19 using an MBE or MOCVD apparatus, as shown in FIG. 4(f). The result is shown in a cross sectional view of FIG. 5 taken along the line D—D of FIG. 4(f). As apparent, the second current blocking layer 5b is absent in the cross section. The semiconductor laser structure allows the absorption loss type waveguide to be eliminated across the width M of the recess so that the mixed crystal factor z of Al in the first n-Al$_z$Ga$_{1-z}$As current blocking layer 5a only is dominant in the recess area.

Finally, the rear surface of the semiconductor multi-layer structure 19 is subjected to lapping of a given thickness and electrodes are arranged on both the lower surface of the n-GaAs substrate 1 and the upper surface of the p-GaAs substrate 1 and the upper surface of the p-GaAs contact layer 7. The multi-layer structure is then sliced to semiconductor laser chips.

According to the method of Example like Example 1, the Al$_x$Ga$_{1-x}$As upper cladding layer has at its current injecting area no regrowing interface. This allows Example 2 to be higher in the operational reliability than Example 1 but slenderly less in the simplicity of production steps.

The insulating layer 18 is not limited to Si$_3$N$_4$ material but other appropriate masking materials including SiO$_2$ may be used with equal success.

In either of the examples, the distance M of the resonator extension is free from the second n-GaAs current blocking layer and provides an optical waveguide effect controlled by the first n-Al$_z$Ga$_{1-z}$As current blocking layer. As the action of the second n-GaAs current blocking layer is effective in the other area than the recess of M, a light wave is guided by the action of absorption loss induced by the GaAs material across the semiconductor structure which embodies the primary object of the present invention.

The etching process in both Examples 1 and 2 is not limited to a wet etching but a dry etching will be employed with equal success. It is good idea for forming the stripe recess 15 in Example 1 to use a reactive ion beam etching technique rather than a plurality of the described selective etching steps since a target to be etched can be monitored during the etching action in a vacuum and increased in the efficiency of operation.

Figure 6:
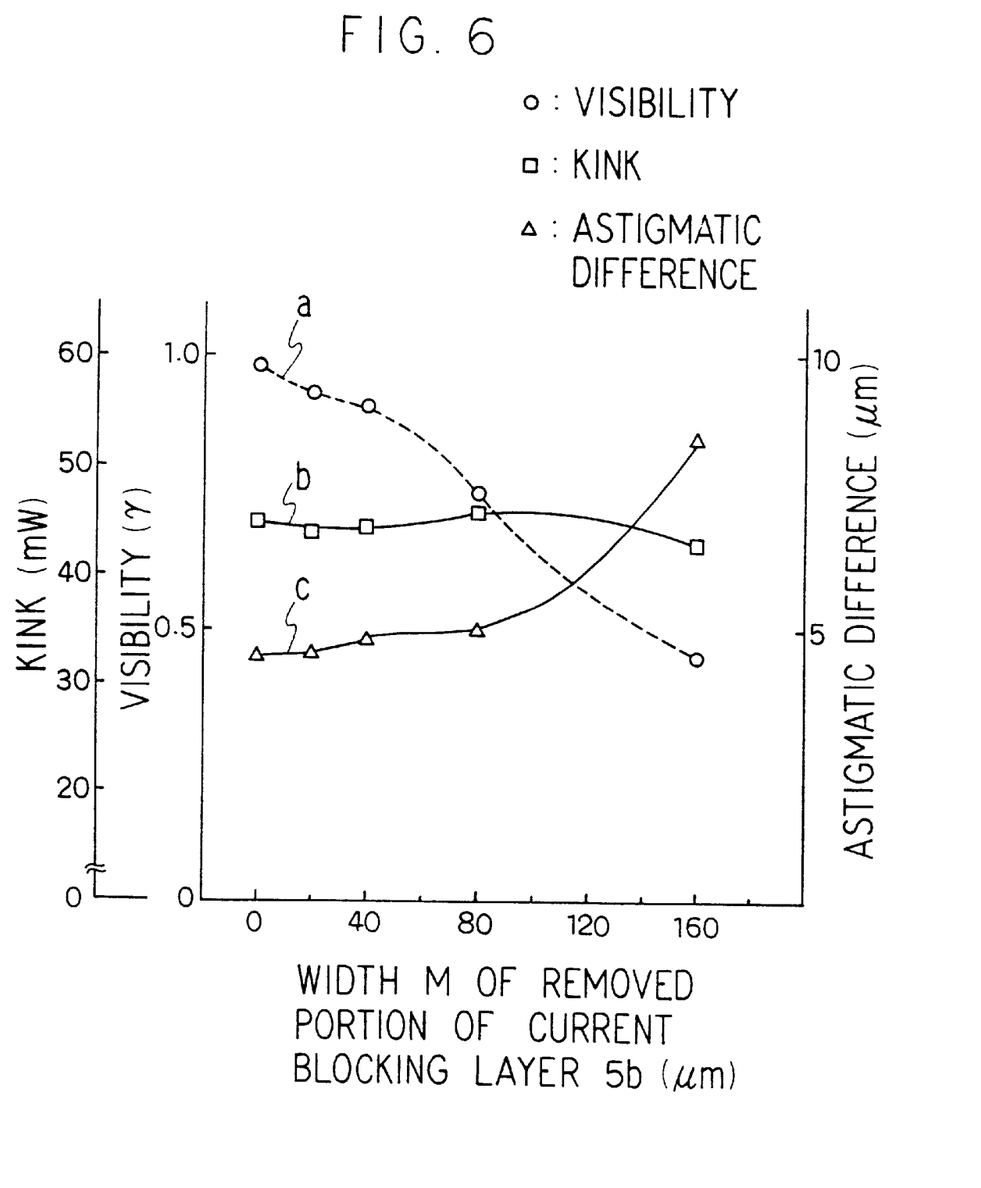
FIG. 6 is a diagram showing characteristics of a semiconductor laser produced in Example 2.

FIG. 6 is a diagram showing the relation of a visibility (γ), an astigmatic difference, and a kink (a power output with an electrical optical characteristic being instable) when the width M of the slit 14 in Example 1 is varied to 20, 40, 80, and 160 micrometers at 2 mW of the power output, provided that the n-Al$_x$Ga$_{1-x}$As lower cladding layer 2 is 20000 angstroms in thickness, the Al$_y$Ga$_{1-y}$As lower cladding layer 3 is 500 angstroms, the first p-Al$_x$Ga$_{1-x}$As upper cladding layer 4 is 500 angstroms, the n-GaAs etching stop layer 10a is 100 angstroms, the first n-Al$_z$Ga$_{1-z}$As current blocking layer 5a is 1500 angstroms, the second n-GaAs current blocking layer 5b is 2000 angstroms, the n-Al$_w$Ga$_{1-w}$As evaporation protective layer 11 is 700 angstroms, the second p-Al$_x$Ga$_{1-x}$As cladding layer 6 is 18000 angstroms, the p-GaAs contact layer 7 is 16000 angstroms, the mixed crystal factors x, y, z, and w of Al are 0.6, 0.12, 0.63 and 0.12 respectively. The stripe recess 15 is 4 micrometers in width, and the resonator length L is 350 micrometers. As apparent from the dotted line a, increase of M results in decrease of r or triggering of the vertical multi-mode oscillation. Also, as expressed by the real line c, the astigmatic difference is correspondingly increased but stays under 10 micrometers when M is 160 micrometers. Meanwhile, the kink remains unchanged as shown by the real line b. This may be explained by an offset action that when M is increased enhancing the effect of the gain waveguide and thus decreasing the kink, the absorption loss decreases to increase the differential efficiency.

As set forth above, the semiconductor laser which performs the vertical multi-mode oscillation while maintaining a high level of the kink and a small value of the astigmatic difference is produced by the method of the present invention.

Most conventional semiconductor lasers of more than 30 mW of output power for use as a light source for data write action are commonly high in the coherent effect during producing as a low output power as 2 mW. Hence, for reading the data from an optical disk with the conventional semiconductor laser, a high-frequency superimposing circuit is needed. The semiconductor laser of the present invention is however designed to actuate pickup device with no need of the high-frequency superimposing circuit and also to be easily fabricated in mass production.

More specifically, the advantages of the present invention are:

(1) that an improved semiconductor laser is provided which performs a stable lateral mode action while maintaining small astigmatic difference and low noise before emitting a high power output;

(2) that the design parameters of a semiconductor laser are easily modified for satisfying a variety of application; and (3) that a semiconductor laser is provided which forms a data read/write pickup device of which high-frequency superimposing circuit is eliminated.

Though several embodiments of the present invention are described above, it is to be understood that the present invention is not limited only to the above-mentioned, various changes and modifications may be made in the invention without departing from the sprit and scope thereof.

What is claimed is:

1. A semiconductor laser having a double hetero junction structure comprising:

a lower cladding layer;

an active layer formed on said lower cladding layer;

a current blocking layer formed on said active layer, said current blocking layer including a) a stripe recess acting as a current passage and b) a slit extending transversely to said stripe recess, said slit having a predetermined distance for vertical multi-mode oscillation and having no absorption loss, said current blocking layer comprising a plurality of layers, at least one layer of said plurality of layers absorbing light and at least another layer not absorbing light and said at least one layer of said plurality of layers including both said stripe recess and said slit and said another layer including only said stripe recess; and an upper cladding layer formed on said current blocking layer.

2. The semiconductor laser according to claim 1, wherein said layers of the current blocking layer include one layer having a forbidden band gap greater than said active layer and another layer having another forbidden band gap equal to or smaller than said active layer and the slit is arranged in said another layer.

3. A semiconductor laser having a double hetero junction structure comprising:

an active layer;

cladding layers comprising an upper layer and a lower layer, said cladding layers sandwiching said active layer; and a current blocking layer comprising a stripe recess acting as a current passage, said current blocking layer being provided within at least one of said cladding layers;

wherein said current blocking layer comprises two layers, a) one layer of said two layers being a non-absorption layer which absorbs no light, having a forbidden band gap greater than said active layer and including said stripe recess and b) another layer of said two layers being an absorption layer which absorbs light, having another forbidden band gap equal to or smaller than said active layer and including both said stripe recess and a slit extending traversely to said stripe recess.

4. An optical pick up system having a semiconductor laser as a light source for writing and reading of records, including a double hetero junction structure wherein said semiconductor laser comprising:

a lower cladding layer;

an active layer formed on said lower cladding layer;

a current blocking layer formed on said active layer, said current blocking layer including a) a stripe recess acting as a current passage and b) a slit extending transversely to said stripe recess, said slit having a predetermined distance for vertical multi-mode oscillation and having no absorption loss, said current blocking layer comprising a plurality of layers, at least one layer of said plurality of layers absorbing light and at least another layer not absorbing light and said at least one layer of said plurality of layers including both said slit and said stripe recess and said at least another layer including only said stripe recess; and an upper cladding layer formed on said current blocking layer.

5. The optical pickup system of claim 4, wherein said layers of the current blocking layer include one layer having forbidden band gap greater than said active layer and another layer having another forbidden band gap equal to or smaller than said active layer and the slit is arranged in said another layer.

6. An optical pick up system having a semiconductor laser as a light source for writing and reading of records, including a double hetero junction structure wherein said semiconductor laser comprising:

an active layer;

cladding layers comprising an upper layer and a lower layer, said cladding layers sandwiching said active layer; and a current blocking layer comprising a stripe recess acting as a current passage, said current blocking layer being provided within at least one of said cladding layers;

wherein said current blocking layer comprises two layers, a) one layer of said two layers being a non-absorption layer which absorbs no light, having a forbidden band gap greater than said active layer and including said stripe recess and b) another layer of said two layers being an absorption layer which absorbs light, having another forbidden band gap equal to or smaller than said active layer and including both said stripe recess and a slit extending traversely to said stripe recess.

7. A semiconductor laser having a double hetero-junction structure comprising:

a lower clad layer;

an active layer formed on said lower clad layer;

a current blocking layer formed on said active layer, said current blocking layer including a) a stripe recess acting as a current passage and b) a slit extending transversely to said stripe recess, said current blocking layer comprising a plurality of layers, at least one layer of said plurality of layers absorbing light and at least another layer not absorbing light and said at least one layer of said plurality of lasers including both said stripe recess and said slit and said another layer including only said stripe recess; and an upper cladding layer formed on said current blocking layer.

* * * * *